United States Patent [19]  
Engel

[11] 3,953,178  
[45] Apr. 27, 1976

[54] COATED METAL PRODUCT  
[76] Inventor: Niels N. Engel, 720 Gonzales Road, Santa Fe, N. Mex. 87501  
[22] Filed: June 21, 1974  
[21] Appl. No.: 481,486

Related U.S. Application Data  
[62] Division of Ser. No. 279,244, Aug. 9, 1972, Pat. No. 3,915,757.

[52] U.S. Cl. ............................... 29/195; 29/196  
[51] Int. Cl.² ........................................ B32B 15/04  
[58] Field of Search ......................... 29/195 A, 196

[56] References Cited  
UNITED STATES PATENTS

| | | | |
|---|---|---|---|
| 3,712,798 | 1/1973 | Van Thyne et al. | 29/195 |
| 3,772,058 | 11/1973 | Bloom | 117/62 |
| 3,796,588 | 3/1974 | Hintermann et al. | 117/71 M |
| 3,833,968 | 9/1974 | Arai | 19/114 |

FOREIGN PATENTS OR APPLICATIONS  
2,202,015   7/1972   Germany ........................... 148/4

Primary Examiner—L. Dewayne Rutledge  
Assistant Examiner—E. L. Weise  
Attorney, Agent, or Firm—Newton, Hopkins & Ormsby

[57] ABSTRACT

An ion plating method and product therefrom wherein ions of a metal are implanted into or/and plated onto a substrate to increase the hardness of the surface. After plating, the product can be reacted with carbon, boron, nitrogen or another metal, thereby forming the carbide, boride, nitride or metal compound of the plating metal coating. Hardening of the product by quenching follows which produces a cutting tool of superior qualities.

6 Claims, No Drawings

COATED METAL PRODUCT

This application is a divisional of Ser. No. 279,244, filed Aug. 9, 1972, now U.S. Pat. No. 3,915,757, dated Oct. 28, 1975.

BACKGROUND OF THE INVENTION

This invention relates to an improved metalic deposition on a substrate and more particularly to an ion plating method and product therefrom.

The cutting power and edge life of knife blades depend upon the presence of a matrix structure of slightly tempered martensite of high hardness and the embedding of a sufficient number of finely and uniformly distributed carbides in this matrix.

There are many procedures utilized in the formation of cutting tools to provide a cutting edge of great hardness and durability.

With stainless steel, for example, the carbon content of the steel substrate has been increased in order to increase the proportion of hard chromium carbides in the structure when used as cutting materials. Other carbide-forming alloying constituents, such as molybdenum, tungsten, vanadium, titanium and the like have also been added to the substrate. Coated substrates provide good cutting tools and wear resistant surfaces. Since corrosion often is a factor causing cutting edges or wear resistant surfaces to decay, alloys or alloying elements increasing corrosion resistance which can be added to substrate are of great benefit. Various techniques have beem employed to coat the surface of a substrate with a material, including ion deposition as disclosed in the patents to Hamilton, U.S. Pat. No. 3,404,084, issued Oct. 1, 1968; Bucek, U.S. Pat. No. 2,916,409, issued Dec. 8, 1959; and Hanson, et al., U.S. Pat. No. 3,192,892, issued July 6, 1965. However, none of these coating techniques included steps for producing a truly superior cutting edge.

SUMMARY OF THE INVENTION

Briefly described, the present invention includes the steps of cleaning the surface of a steel or iron containing alloy substrate; implanting a sufficient amount of ions of a metal selected from the group consisting of refractory elements (scandium, titanium, zirconium, hafnium, vanadium, columbium, tantalum, chromium, molybdenum and tungsten), the rare-earth elements (lanthanum, cerium, praseodymium, neodymium, promethium, samarium, europium, gadolinium, terbium, dysprosium, holmium, erbium, thulium, yttrium, ytterbium and lutetium), the actinide series (actinium, thorium, protactinium, uranium, neptunium, plutonium,, americium, curium, berkelium, californium, einsteinium, fermium, mendelevium, nobelium and lawrencium), iron, nickel, colbalt and boron to alloy the substrate to a preselected depth; plating a selected one of the above ions onto the substrate surface subsequent to implanting the ions; reacting the coating substrate with carbon, boron, nitrogen or a selected one of the above metals other than the implanted metal to form the carbide, boride, nitride or metal compound of the plating metal; and hardening by quenching if the substrate is steel. This treatment of the substrate produces a superhard martensite and a much harder coat of the carbide, boride, nitride or metal compound to form an excellent cutting edge.

A still further object of the present invention is to provide cutting and abrading tools which have superior cutting power, durability, strength and corrosion and wear resistance.

An object of the present invention is to provide an iron plated product which is very resistant to thermal shock.

Another object of the present invention is to provide an improved cutting edge which has a low coefficient of friction.

Still other objects and advantages of the present invention will become apparent after reading the accompanying description of the selected illustrative embodiment.

DESCRIPTION OF THE INVENTION

Ion implanting in any metal will generally cause an increase in the hardness and strength of the metal. Ion implantation into a carbon containing steel combined with a hardening treatment leads to a superhard martensite independent of the implanted material. In ion implanting a steel substrate, the carbon content of the substrate should range from 0.3% to 1.8% by weight, with the optimum range being from 0.5% to 0.8% by weight. A substrate having a carbon content below 0.3% is called "mild" steel and is too soft for cutting tools and various wear resistant objects. Their coats will easily break down if the support or substrate is much softer and weaker than the coating itself. Therefore, substrates should be hard, preferably hardened steel. There is actually no maximum limit of the carbon percentage within the substrate; it depends on how brittle it is desired that the substrate be after it has been quenched as discussed below. The substrate used in the present invention can be any steel or iron containing alloy.

The ion implantation yields the advantage that the hardened matrix is harder than martensite obtained by normal hardening methods. Ion plating combined with a hardening of the ion implanted matrix constitutes a method to obtain the hardest coats on a superhard matrix, which cannot be obtained by any other method. At the same time, the adherence between coat and matrix is better than can be obtained by any other method.

The first step in the ion plating process of the present invention is to clean the substrate. The substrate is cleaned by any suitable method and then is quickly mounted on a metal holder with the edges to be ion plated exposed. The holder is transferred to a vacuum chamber for ion implantation and plating wherein the substrate forms the cathode.

The chamber is pumped down to a vacuum of $2 \times 10^{-5}$ mmHg or better with frequent flushing with argon gas. Such a low pressure is necessary to support the plasma that is created therein as described below. Argon gas is let into the chamber. An electrical potential is then applied to the cathode (substrate) and is gradually increased until a pink argon plasma is formed. Argon is used as it will not react with the substrate or with the ion plating material and is heavy so as to increase the impact force of the ions on the substrate whereby better cleaning action is achieved. The plasma forming starts in the range of 1KV and 50 mamps and can then be maintained to much lower potentials. The power setting can be varied according to the needs. The object to be ion plated is first ion cleaned with the argon plasma. The argon sputters off any atomic impurities or dirt that are present on the substrate surface and inherently implants this inert gas into the surface of the substrate to produce a subsurface containing the argon (an inert gas) as an element which is insoluble in the substrate.

The ion plating material on a filament (such as a tungsten wire) or from a pool of melted metal heated by an electron gun forms the anode within the chamber. By passing sufficient current through this filament while the argon plasma is holding, the filament (anode) is gradually heated until the material on the anode melts and, aided by the substantial vacuum within the chamber, then vaporizes These ionized particles are attracted to the cathode (object to be ion plated) due to the great potential difference (which can vary from 500V to 50,000V), and thus, ion implantation and/or plating is accomplished.

Actually, the first ions that strike the substrate surface are implanted within the substrate and cause a gradual transition between the substrate and the surface. As the substrate becomes "saturated" by the ion implantation, the remainder of the ions are deposited on the substrate surface.

The "penetration depth" of the ion implantation into the substrate depends on the hardness of the substrate. Generally a substrate having a hardness of less than 50 Rockwell C is preferred.

When the implanted ions react with the carbon present in the substrate, it is not known at this time whether they form a precipitate or are in "solution" within the crystalline lattice of the substrate. This is due to the fact that compounds formed by the implanted ions are too small to be observed by present day methods.

The time of ion plating can be varied from fractions of seconds to several minutes. During the ion plating process, the pressure in the chamber does drop somewhat, but should be maintained at the right level by adjusting the argon pressure or metal vaporization.

Objects Ion Plated: The above ion plating procedure can be performed on a number of steel or iron containing alloys, such as razor blades, industrial blades, band saws, files, nails, etc., as well as other metals and shapes including meat chopper plates.

Ion Plating Materials: A wide range of elements can be ion plated onto the substrate. These include all of the refractory elements (scandium, titanium, zirconium, hafnium, vanadium, columbium, tantalum, chromium, molybdenum and tungsten) the rare-earth elements (lanthanum, cerium, praseodymium, neodymium, promethium, samarium, europium, gadolinium, terbium, dysprosium, holmium, erbium, thulium, yttrium, ytterbium, and lutetium), the actinide series (actinium, thorium, protactinium, uranium, neptunium, plutonium, americium, curium, berkelium, californium, einsteinium, fermium, mendelevium, nobelium, and lawrencium), iron, cobalt, nickel and boron. Some of these metals require a high powered vaporization unit, such as an electron gun, in order to evaporate the same. In industrial production, electron gun vaporization would be preferred.

Carburizing, Boriding, Nitriding, and Metallizing: Wear resistant and corrosion resistant cutting edges are obtained with superhard materials which can be added to the ion implanted substrate surface. The hardest known materials are carbides, borides, and nitrides and compounds of transistion elements with second period elements, for example TiC, ScN, VC, $Cr_4C_3$, TiB, $B_4C$, and BN. Additionally, any metal included in the above list of ion plating materials, other than the metal already plated on the substrate, can be added to the ion implanted substrate surface. These materials can be added to the substrate as compounds; however, they are very stable and difficult to evaporate. The best procedure is to ion plate the pure metal (Ti, Cr, B, Sc, etc.) onto the substrate, and then convert the metal to the respective carbide, boride or nitride.

Whether to use carbon, boron or nitrogen depends upon the substrate coating. For instance, carbon is the best material to react with titanium, boron with vanadium and nitrogen with scandium.

The carburizing, boriding, nitriding or metallizing must be accomplished in an oxygen free atmosphere, because an oxide of the metal coating on the substrate might be formed which would be more brittle than the carbide, boride or nitride of that metal.

Carburizng can occur in a number of ways: a gas containing carbon, such as any hydrocarbon, can be heated up with the coated substrate at a temperature ranging from 600°–900°C (usually above 800°C) whereby the carbon and the metal coating react to form a carbide, such as TiC, etc.

The coated substrate can also be carburized by any other suitable means such as by any conventional box, cyanide or gas carburizing method. It can also be treated in a plasma formed by a nitrogen-propane mixture (or any other carburizing gas mixture including carbon evaporated from an arc.)

Hardening: The last step is hardening of the carburized, borided, nitrided or metallized substrate to bring the substrat to the martensitic state. Hardening can be accomplished by any conventional means, such as quenching in water (e.g., heating the substrate to the austenite range and cooling it with a super critical cooling velocity), by induction or by impulse hardening. Hardening can be carried out as a separate process after alloying the coat or in a combined process. Superior properties have been obtained by a fast heating of the cutting edge or a sawtip and quenching in a cooling agent or by using the matrix as a heat sink.

Thickness of Ion Implantation: The penetration depth of the ions within the substrate can be controlled by a number of factors such as speed of vaporization, time, potential, pressure and geometry. The penetration depth usually runs from 1 to 20 mils thick.

Normally the martensite of cutting edges have a Knoop hardness of 850–900, with 1,000 being the approximate maximum. Cutting edges or abrasive materials treated in accordance with the present invention have a martensite with a Knoop hardness which is greater than 1,200. In the case of titanium ion implantation, it is titanium carbide that imparts the very high hardness on the superhard marte site matrix. In the case of iron and nickel ion implantation, for instance, a martensite of superior hardness is obtained.

A piece of plain carbon steel carburized and hardened in the normal manner resulted in a martensite which did not scratch a plate glass. However, the martensite obtained in nickel and iron ion plated steel repeatedly scratched glass. The titanium ion plated and subsequently carburized surfaces cut glass almost as well as diamonds.

Two files, one in annealed and another in hardened condition, were ion implanted and plated with titanium. They were carburized in a methane and hydrogen atmosphere and hardened by water quenching. It was found that there was a difference of nearly 300 points in the Knoop hardness between the two:

Annealed file    1120 Khn
Unannealed file    825 Khn

It is believed that this difference in hardness is caused by the ability of dislocations to penetrate into the material. The mechanism of creating superhard martensite is most probably that atoms inpinging on the metal surface initiate a dislocation which moves to a certain depth into the material carrying the impinged atom with it. Soft materials are permeable to dislocations and can therefore absorb impinging atoms to penetrate below the surface.

Table I-continued

| | Knoop Hardness Numbers Load (100 gms) | |
|---|---|---|
| | Sample A | Sample B |
| | 1080 | 880 |
| Interior | 915 | 880 |
| | 910 | 880 |

Typical hardness values for samples under varying experimental conditions of voltage, current, ion plating material and time of ion plating are presented in Table II.

Table II

| Material Ion Plated | Ion Plating Material and Atmosphere | Time Of Ion Plating (Minutes) | Voltage (KV) | Current (mamps) | Carburizing Medium | Hardness Close To The Surface KHN(50 gms) | Remarks |
|---|---|---|---|---|---|---|---|
| Plain Carbon Steel | Ti/Argon | 2 | 2 | 100 | *C+$H_2$ | 1180 | Scratches glass repeatedly and deeply |
| Plain Carbon Steel | Ti/Argon | 3 | 2 | 100 | *C+$H_2$ | 1020 | Fair |
| Plain Carbon Steel | Ti/Argon | 2 | 4 | 100 | *C+$H_2$ | 1230 | Good |
| Plain Carbon Steel | Ti/Argon | ½ | 2 | 100 | *C+$H_2$ | 1240 | Good |
| Plain Carbon Steel | Ti/Argon | 5 | 2 | 100 | *C+$H_2$ | 1050 | Fair |
| Plain Carbon Steel | Fe/Argon | 2 | 2 | 100 | *C+$H_2$ | 1160 | Good |
| Plain Carbon Steel | Al/Argon | 1 | 2 | 100 | *C+$H_2$ | 950 | Poor |
| Plain Carbon Steel | Ti/Propane | 2 | 2 | 100 | Impulse Hardened | 1030 | Fair |
| Steel File-Annealed | Ti/Argon | 3 | 3 | 100 | *C+$H_2$ | 1120 | Very Good |
| Steel File (Hardened) | Ti/Argon | 3 | 3 | 100 | *C+$H_2$ | 825 | Poor |
| Plain Carbon Steel | None | — | — | — | $N_2$-$C_3H_8$/Plasma | 885 | Poor |
| Plain Carbon Steel | None | — | — | — | Impulse Hardened | 965 | Poor |

All the samples were ion cleaned for 2 minutes in argon except No. 2.
) *C-carbon-containing gaseous compound, such as methane.

An advantage of the present invention is that it produces an adhesion between the coating and the substrate which is greater than the strength of the substrate. Glue was placed on a portion of the coated substrate. In an attempt to pull the coating away from the substrate surface, either the substrate or the glue broke under the tension, The "joint" or coating/substrate interface never did break.

The method of this invention produces a coating on a substrate which is very resistant to thermal shock. Extreme and sudden temperature changes do not efffect either the coating or the joint. This can be obtained by the selection of a coat with a smaller thermal expansion than the substrate. When cooled after plating at a somewhat elevated temperature, the coat will be under compressive stresses. Also, the selection of a coat material with a low coefficient of friction will prevent heating through rubbing such as with chopper plates in meat cutting. A titanium carbide coat, for example, yields both advantages simultaneously and, therefore, increases the resistance to thermal shock.

Table I

| | Knoop Hardness Numbers Load (100 gms) | |
|---|---|---|
| | Sample A | Sample B |
| Edge | 1480 | 885 |
| | 1110 | 885 |

What is claimed is is:

1. A coated metal product comprising, a steel martensitic substrate, a metal selected from the group consisting of: scandium, titanium, zirconium, hafnium, vanadium, columbium, tantalum, chromium, molybdenum, tungsten, lanthanum, cesium, praseodymium, neodymium, promethium, samarium europium, gadolinium, terbium, holmium, dysprosium, erbium, thulium, yttrium, ytterbium, lutetium, actinium, thorium, protactinium, uranium, neptunium, plutonium, americium, curium, berkelium, californium, einsteinium, fermium, mendelevium, nobelium, lawrencium, iron, cobalt, nickel and boron imbedded by ion bombardment into the surface area of said steel substrate, and a metal salt selected from the group consisting of a carbide, boride and nitride of said selected metal, bonded to the outer surface of said selected metal.

2. The coated metal product defined in claim 1 wherein the Knoop hardness of the martensite close to the surface of the substrate exceeds 1,200.

3. A coated metal product comprising:
   a. a martensitic iron substrate;
   b. an implanted subsurface along the surface of said substrate, said subsurface containing an element which is insoluble in said substrate; and
   c. a coating along said subsurface of a coating metal and a hardening substance reacted with said coating metal, said substance creating with said coating metal, a layer which is harder than the coating metal, itself.

4. The coated metal product defined in claim 3 wherein said first metal is steel, said insoluble element is an inert gas and said coating metal is selected from the group consisting of scandium, titanium, zirconium, hafnium, vanadium, columbium, tantalum, chromium, molybdenum, tungsten, lanthanum, cesium, praseodymium, neodymium, promethium, samarium, europium, gadolinium, terbium, holmium, dysprosium, erbium, thulium, yttrium, ytterbium, lutetium, actinium, thorium, protactinium, uranium, neptinium, plutonium, americium, curium, berkelium, californium, einsteinium, fermium, mendelevium, nobelium, lawrencium, iron, cobalt, nickel and boron.

5. The coated metal product defined in claim 4 wherein said hardening substance is selected from the group consisting of carbon, boron, nitrogen and a selected one of said elements other than the implanted element so as to form the carbide, boride, nitride or compound of the respective elements.

6. The coated metal product defined in claim 5 wherein said substrate is martensite, the product having a Knoop hardness in excess of 1,000.

* * * * *

UNITED STATES PATENT OFFICE
CERTIFICATE OF CORRECTION

Patent No. 3,953,178                Dated April 27, 1976

Inventor(s) Niels N. Engel

It is certified that error appears in the above-identified patent and that said Letters Patent are hereby corrected as shown below:

The term of this patent subsequent to October 28, 1992, has been disclaimed.

Signed and Sealed this twenty-second Day of June 1976

[SEAL]

Attest:

RUTH C. MASON
*Attesting Officer*

C. MARSHALL DANN
*Commissioner of Patents and Trademarks*